United States Patent
Diwu (10) Patent No.: US 11,990,174 B2
(45) Date of Patent: May 21, 2024

(54) METHOD FOR DETECTING MEMORY DEVICE, COMPUTER STORAGE MEDIUM, AND ELECTRONIC DEVICE

(71) Applicant: CHANGXIN MEMORY TECHNOLOGIES, INC., Hefei (CN)

(72) Inventor: Tianhao Diwu, Hefei (CN)

(73) Assignee: Changxin Memory Technologies, Inc., Hefei (CN)

(*) Notice: Subject to any disclaimer, the term of this patent is extended or adjusted under 35 U.S.C. 154(b) by 169 days.

(21) Appl. No.: 17/851,530

(22) Filed: Jun. 28, 2022

(65) Prior Publication Data
US 2023/0267985 A1    Aug. 24, 2023

(30) Foreign Application Priority Data
Feb. 24, 2022 (CN) .......................... 202210172861.2

(51) Int. Cl.
| | | |
|---|---|---|
| G11C 11/34 | (2006.01) | |
| G11C 11/406 | (2006.01) | |
| G11C 11/4074 | (2006.01) | |
| G11C 11/4078 | (2006.01) | |
| G11C 11/408 | (2006.01) | |
| G11C 11/4094 | (2006.01) | |

(52) U.S. Cl.
CPC .... G11C 11/40618 (2013.01); G11C 11/4074 (2013.01); G11C 11/4078 (2013.01); G11C 11/4085 (2013.01); G11C 11/4094 (2013.01)

(58) Field of Classification Search
CPC ........ G11C 11/40618; G11C 11/40622; G11C 11/4085; G11C 2029/1202; G11C 11/4074; G11C 11/4078; G11C 29/52; G11C 29/50; G11C 29/12
See application file for complete search history.

(56) References Cited

U.S. PATENT DOCUMENTS

| | | | |
|---|---|---|---|
| 5,034,923 A | 7/1991 | Kuo | |
| 5,428,574 A | 6/1995 | Kuo | |
| 10,811,109 B2 | 10/2020 | Baraskar et al. | |
| 11,488,651 B2 * | 11/2022 | Rehmeyer | ............. G11C 11/403 |

(Continued)

FOREIGN PATENT DOCUMENTS

| | | |
|---|---|---|
| CN | 100421184 C | 9/2008 |
| CN | 102426858 A | 4/2012 |

(Continued)

*Primary Examiner* — Uyen Smet
(74) *Attorney, Agent, or Firm* — Cooper Legal Group, LLC (57) ABSTRACT

Provided is a method for detecting a memory device. First data is written into memory cells connected to first target word lines; second data is written into memory cells connected to second target word lines arranged between the first target word lines; a first voltage adjustment is performed on the memory cells connected to the first target word lines; the second target word lines are alternately turned on and off for a first preset number of times, upon completion of the first voltage adjustment; a second voltage adjustment is performed on the memory cells connected to the first target word lines; the second target word lines are alternately turned on and off for a second preset number of times, upon completion of the second voltage adjustment; and a read operation is performed on the memory cells connected to the first target word lines.

20 Claims, 3 Drawing Sheets

(56) References Cited

U.S. PATENT DOCUMENTS

| | | | |
|---|---|---|---|
| 2003/0012067 A1 | 1/2003 | Wong | |
| 2012/0263002 A1 | 10/2012 | Huang | |
| 2020/0145599 A1 | 5/2020 | Matsuzaki et al. | |
| 2020/0294572 A1* | 9/2020 | Hou | ................. G11C 11/40615 |

FOREIGN PATENT DOCUMENTS

| | | |
|---|---|---|
| CN | 103117094 A | 5/2013 |
| CN | 104425036 A | 3/2015 |
| CN | 104681102 A | 6/2015 |
| CN | 106601287 A | 4/2017 |
| CN | 104425036 B | 10/2018 |
| CN | 110637415 A | 12/2019 |
| CN | 111630599 A | 9/2020 |
| CN | 113077836 A | 7/2021 |
| JP | H02235300 A | 9/1990 |

\* cited by examiner

METHOD FOR DETECTING MEMORY DEVICE, COMPUTER STORAGE MEDIUM, AND ELECTRONIC DEVICE

CROSS-REFERENCE TO RELATED APPLICATION

This application is based on and claims priority to Chinese Patent Application No. 202210172861.2, filed on Feb. 24, 2022, entitled "METHOD AND APPARATUS FOR DETECTING MEMORY DEVICE, COMPUTER STORAGE MEDIUM, AND ELECTRONIC DEVICE", the content of which are hereby incorporated by reference in its entirety.

TECHNICAL FIELD

The present disclosure relates to the technical field of semiconductor device testing, and particularly, to a method for detecting a memory device, a computer storage medium, and an electronic device.

BACKGROUND

Dynamic random access memory is abbreviated as DRAM, and DRAM Array denotes a dynamic random access memory array structure.

At present, during the process for detecting the DRAM Array, since data retention time of memory cells in the dynamic random access memory array is volatile, that is, charges of the memory cells in the DRAM Array are continuously lost and thus decreased, the coverage rate of the DRAM Array in the post stage of the test is affected.

Therefore, how to solve the above problems has become a technical problem to be urgently solved by those skilled in the art.

SUMMARY

A first aspect of embodiments of the present disclosure provides a method for detecting a memory device, the method including:
writing first data into memory cells connected to first target word lines;
writing second data into memory cells connected to second target word lines arranged between the first target word lines;
performing a first voltage adjustment on the memory cells connected to the first target word lines, to increase a voltage difference between the first target word lines and the second target word lines;
alternately turning on and off the second target word lines for a first preset number of times, upon completion of the first voltage adjustment;
performing a second voltage adjustment on the memory cells connected to the first target word lines, to increase the voltage difference between the first target word lines and the second target word lines;
alternately turning on and off the second target word lines for a second preset number of times, upon completion of the second voltage adjustment; and
performing a read operation on the memory cells connected to the first target word lines.

A second aspect of embodiments of the present disclosure provides a computer storage medium having stored thereon a computer program which, when executed by a processor, implements steps of the method for detecting the memory device described above.

A third aspect of embodiments of the present disclosure provides an electronic device, comprising a processor and a memory, wherein the memory is configured to store a computer program executable by the processor; when the computer program is executed by the processor, the processor is configured to implement steps of the method for detecting the memory device described above.

DETAILED DESCRIPTION

In order to make the objectives, technical solutions and advantages of the present disclosure clearer, the present disclosure will be further described in detail below in conjunction with the specific embodiments and with reference to the accompanying drawings. It should be understood that these descriptions are merely exemplary and are not intended to limit the scope of the present disclosure. Furthermore, the descriptions of the known structures and techniques are omitted in the in the following, to avoid unnecessarily confusing the concepts of the present disclosure.

In order to facilitate the understanding of the present disclosure, the present disclosure will be described more fully below with reference to the related figures. Embodiments of the present disclosure are shown in the figures. However, the present disclosure may be implemented in many different forms and is not limited to the embodiments described herein. Rather, these embodiments are provided in order to make the disclosure of the present disclosure more thorough and comprehensive.

Unless otherwise defined, all technical and scientific terms used herein have the same meaning as commonly understood by those skilled in the art of the present disclosure. The terms used herein in the description of the present disclosure are for the purpose of describing specific embodiments only, and are not intended to limit the present disclosure.

As used herein, the terms of "one", "a", and "the/said" may also include the plural forms, unless the context clearly dictates otherwise. It should also be understood that the term of "including/comprising" or "having" etc., designates the presence of stated features, integers, steps, operations, components, parts or combinations thereof, but does not preclude the possibility of the presence or addition of one or more other features, integers, steps, operations, components, portions, or combinations thereof. At the same time, the term of "and/or" as used in the description may include any and all combinations of related listed items.

At present, during the process for detecting the DRAM Array, since data retention time of memory cells in the dynamic random access memory array is volatile, that is, charges of the memory cells in the DRAM Array is continuously lost and decreased, the coverage rate of the DRAM Array in the post stage of the test is affected.

Therefore, how to solve the above problems has become a technical problem to be urgently solved by those skilled in the art.

A memory device may include a plurality of memory cells, a plurality of bit lines separated from each other, and a plurality of word lines separated from each other. Each bit line may be connected to several memory cells, each word line may be connected to several memory cells, and each memory cell may be connected to a corresponding bit line and a corresponding word line. The memory device may also include a plurality of complementary bit lines, and each complementary bit line and its corresponding bit line have level phases opposite to each other. The memory device may further include a plurality of sensing amplifiers, each sensing amplifier may be electrically coupled to a bit line and a complementary bit line of the bit line. The sensing amplifier may include a power line for providing a low potential voltage and a power line for providing a high potential voltage.

Figure 1:
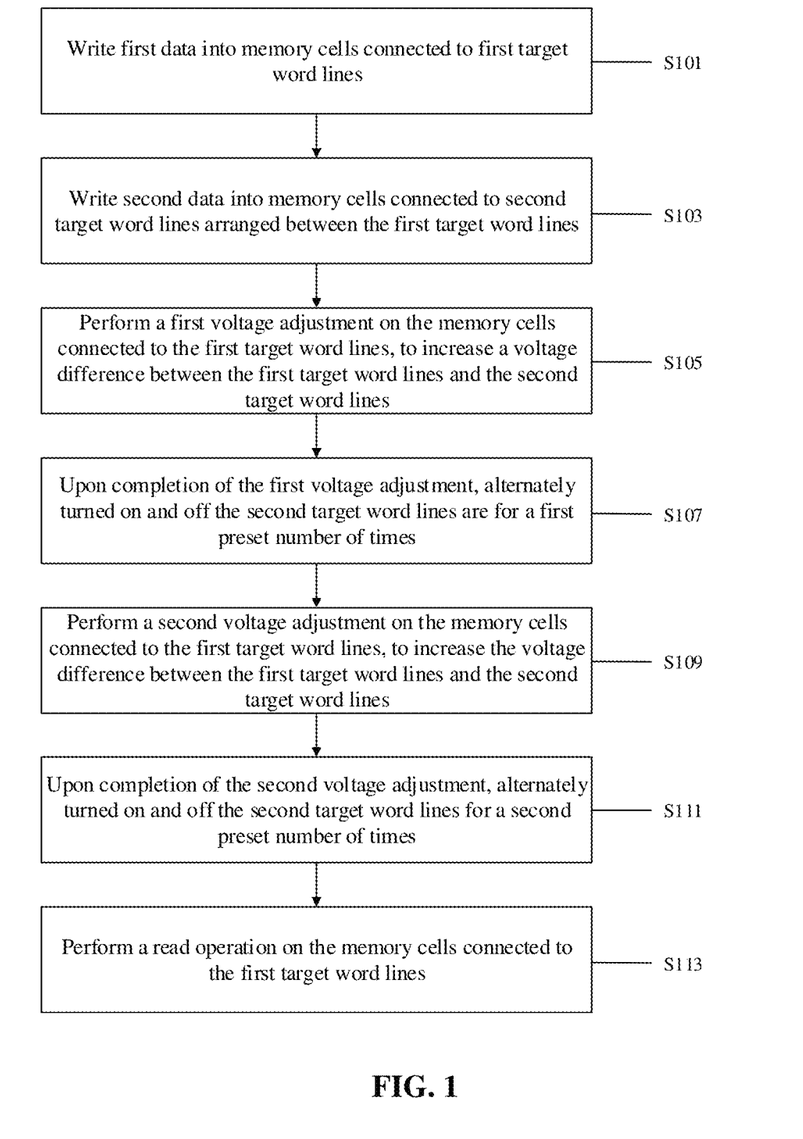
FIG. 1 is a flowchart of a method for detecting a memory device according to an embodiment of the present disclosure.

Based on the above problems, referring to FIG. 1, a first aspect of embodiments of the present disclosure provides a method for detecting a memory device. The method includes steps of S101 to S113. In S101, first data is written into memory cells connected to first target word lines.

In S103, second data is written into memory cells connected to second target word lines arranged between the first target word lines.

In S105, a first voltage adjustment is performed on the memory cells connected to the first target word lines, to increase a voltage difference between the first target word lines and the second target word lines.

In S107, upon completion of the first voltage adjustment, the second target word lines are alternately turned on and off for a first preset number of times.

In S109, a second voltage adjustment is performed on the memory cells connected to the first target word lines, to increase the voltage difference between the first target word lines and the second target word lines.

In S111, upon completion of the second voltage adjustment, the second target word lines are alternately turned on and off for a second preset number of times.

In S113, a read operation is performed on the memory cells connected to the first target word lines.

In the embodiments of the present disclosure, on one hand, the first voltage adjustment is performed on the memory cells connected to first target word lines, which is used to increase the voltage difference between the memory cells connected to the first target word lines and the memory cells connected to the second target word lines, so that the memory cells with a potential risk can be tested earlier. On the other hand, the second target word lines are alternately turned on and off for the preset number of times, and the first voltage adjustment and the second voltage adjustment are performed on the memory cells connected to the first target word lines, which avoids the risk of failure of the memory cells that originally meet the requirements due to excessive voltage decreasement or voltage increasement at one time, Therefore, side effects on the memory cells can be reduced, and the test result can be ensured to be more accurate.

In some embodiments, after performing the first voltage adjustment on the memory cells connected to the first target word lines, the method may further include the following step.

The memory cells connected to the first target word lines and the memory cells connected to the second target word lines may be refreshed.

In some embodiments, a value of the first data written into the memory cells connected to the first target word lines may be configured to be 0, and a value of the second data written into the memory cells connected to the second target word lines may be configured to be 1. Before writing the first data to the memory cells connected into the first target word lines, the method may further include the following step.

A capacitance of the memory cells connected to the first target word lines may be increased from a default value to a first target capacitance value. A voltage difference between the first target capacitance value and the default value may be in a range of 0 to 350 millivolts.

In some embodiments, after alternately turning on and off the second target word lines for the second preset number of times upon the completion of the first voltage adjustment, the method may further include the following steps.

The capacitance of the memory cells connected to the first target word lines may be restored to the default value.

The memory cells connected to the first target word lines and the memory cells connected to the second target word lines may be refreshed.

In the embodiments of the present disclosure, the capacitance of the memory cells connected to the second target word lines can be increased by restoring the capacitance of the memory cells connected to the first target word lines to the default value.

In some embodiments, the method may further include the following step. When performing the first voltage adjustment on the memory cells connected to the first target word lines, a bit line reference voltage corresponding to the memory cells connected to the second target word lines may be adjusted, to increase a voltage difference between the bit line reference voltage and a bit line output voltage of the memory cells connected to the second target word lines.

In the embodiments of the present disclosure, the voltage difference between the bit line reference voltage and the bit line output voltage of the memory cells connected to the second target word lines can be increased by adjusting the bit line reference voltage corresponding to the memory cells connected to the second target word lines. Thus, the memory cells connected to the second target word lines can be restored more quickly when being refreshed, and the test result can ensured to be more accurate.

In some embodiments, a value of the first data written into the memory cells connected to the first target word lines may be configured to be 0, and a value of the second data written into the memory cells connected to the second target word lines may be configured to be 1.

The first voltage adjustment may be configured to decrease a voltage of a lower plate of a capacitor of each of the memory cells connected to the first target word lines, and the second voltage adjustment may be configured to decrease a voltage of a lower plate of a capacitor of each of the memory cells connected to the second target word lines.

In the embodiments of the present disclosure, the voltage difference between the memory cells written with the value of 0 and the memory cells written with the value of 1 can be increased by decreasing the voltage of the lower plate of the capacitor (VPLT) of each of the memory cells written with the value of 0. Thus, the leakage of the memory cells can be accelerated, and the voltage of the memory cells written with the value of 0 can be increased.

In some embodiments, the operation of adjusting the bit line reference voltage corresponding to the memory cells connected to the second target word lines may include the following step.

The bit line reference voltage corresponding to the memory cells connected to the second target word lines may be decreased.

In some embodiments, a sum of a voltage decreasement in the first voltage adjustment and a voltage decreasement in the second voltage adjustment may be less than or equal to 500 millivolts. The voltage decreasement in the first voltage adjustment may be less than or equal to 150 millivolts, and the voltage decreasement in the second voltage adjustment may be less than or equal to 350 millivolts.

In some embodiments, before alternately turning on and off the second target word lines for the first preset number of times, the method may further include the following step.

A capacitance of the memory cells connected to the first target word lines may be increased to a second target capacitance value.

In some embodiments, a voltage difference between the second target capacitance value and a default capacitance value of the memory cells connected to the first target word lines may be in a range of 500 to 750 millivolts.

In some embodiments, a value of the first data written into the memory cells connected to the first target word lines may be configured to be 1, and a value of the second data written into the memory cells connected to the second target word lines may be configured to be 0.

The first voltage adjustment may be configured to increase a voltage of a lower plate of a capacitor of each of the memory cells connected to the first target word lines, and the second voltage adjustment may be configured to increase a voltage of a lower plate of a capacitor of each of the memory cells connected to the second target word lines.

In the embodiments of the present disclosure, the voltage difference between the memory cells written with the value of 1 and the memory cells written with the value of 0 can be increased by increasing the voltage of the lower plate of the capacitor (VPLT) of each of the memory cells written with the value of 1. Thus, the leakage of the memory cells can be accelerated, and the voltage of the memory cells written with the value of 1 can be decreased.

In some embodiments, the operation of adjusting the bit line reference voltage corresponding to the memory cells connected to the second target word lines may include the following step.

The bit line reference voltage corresponding to the memory cells connected to the second target word lines may be increased.

In some embodiments, a sum of a voltage increasement in the first voltage adjustment and a voltage increasement in the second voltage adjustment may be less than or equal to 500 millivolts. The voltage increasement in the first voltage adjustment may be less than or equal to 150 millivolts, and the voltage increasement in the second voltage adjustment may be less than or equal to 350 millivolts In an embodiment according to the present disclosure, referring to FIG. 2, the memory device may include a plurality of word lines, and the plurality of word lines may include first target word lines and second target word lines. It can be understood that, in the embodiment, three second target word lines are arranged between two adjacent first target word lines. It should be noted that the method for detection according to the embodiment of the present disclosure includes but is not limited to the arrangement described above. That is, a desired number of second target word lines may be arranged between two adjacent first target word lines. Based on the word line arrangement determined above, the word lines to be tested may be numbered to satisfy conditional expression of X=X+4. Based on the conditional expression, the first target word lines may be numbered by 0/4/8/C . . . , respectively; and the second target word lines may be numbered by 1/5/9/D . . . , 2/6/A/E . . . , or 3/7/B/F . . . , respectively.

Figure 2:
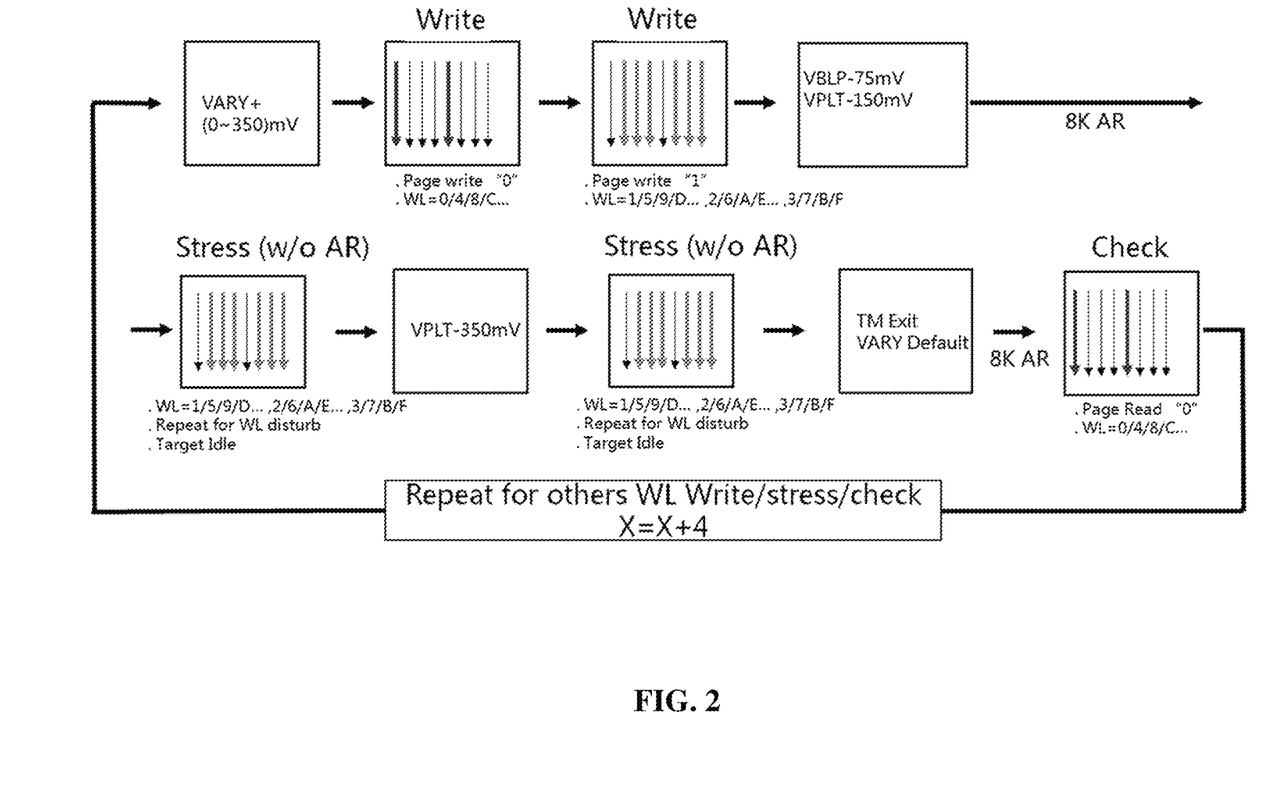
FIG. 2 is a schematic diagram of processings of steps of a method for detecting a memory device according to an embodiment of the present disclosure.

An embodiment of the present disclosure provides a detection method, which may include the following steps of S201 to S213.

In S201, first data may be written into memory cells connected to first target word lines.

In the embodiment, the first data may be written into the memory cells connected to the word lines numbered 0/4/8/C . . . in a Page Write manner, and the value of the first data may be 0.

In S203, second data may be written into memory cells connected to second target word lines arranged between the first target word lines.

In the embodiment, the second data may be written into the memory cells connected to the word lines numbered 1/5/9/D . . . , 2/6/A/E . . . , or 3/7/B/F . . . in the Page Write manner, the value of the second data may be 1.

In S205, a first voltage adjustment may be performed on the memory cells connected to the first target word lines, to increase a voltage difference between the first target word lines and the second target word lines. A voltage of a lower plate of a capacitor of each of the memory cells connected to the first target word lines may be decreased, and a voltage decreasement in the adjustment may be 150 millivolts (i.e., VPLT-150 my in FIG. 2, and the VPLT herein refers to the voltage of the lower plate of the capacitor of each of the memory cells connected to the first target word lines).

In the embodiment of the present disclosure, a voltage difference between the memory cells connected to the first target word lines and the memory cells connected to the second target word lines can be increased by decreasing the voltage of the lower plate of the capacitor of each of the memory cells connected to the first target word lines. Thus, the memory cell with a potential risk can be tested earlier.

In S207, upon completion of the first voltage adjustment, the second target word lines may be alternately turned on and off for a first preset number of times.

In the embodiment, the second target word lines may be alternately turned on and off for a first preset number of times, that is, a gate voltage of the high/low level may be repeatedly applied, so that the interference between the word lines can be clearly highlighted. Thus, the memory cell with a potential risk can be tested earlier.

In S209, a second voltage adjustment may be performed on the memory cells connected to the first target word lines, to increase the voltage difference between the first target word lines and the second target word lines. The voltage of the lower plate of the capacitor of each of the memory cells connected to the first target word lines may be decreased, and the voltage decreasement in the adjustment may be 350 millivolts (i.e., VPLT-350 my in FIG. 2, and the VPLT herein refers to the voltage of the lower plate of the capacitor of each of the memory cells connected to the first target word lines).

In the embodiment of the present disclosure, the voltage difference between the memory cells connected to the first target word lines and the memory cells connected to the second target word lines can be further increased by decreasing again the voltage of the lower plate of the capacitor of each of the memory cells connected to the first target word lines. Thus, the memory cell with a potential risk can be tested earlier. In this embodiment, in combination with the voltage decreasement in the first voltage adjustment, the total voltage decreasement in the embodiment may be 500 millivolts. Relative to one-time voltage decreasement of 500 millivolts, which may cause the failure of the memory cells that originally work normally to further bring additional test risks, the manner of gradually decreasing the voltage is more mitigated, so that the test result can be ensured to be more accurate.

In S211, upon completion of the second voltage adjustment, the second target word lines may be alternately turned on and off for a second preset number of times.

In the embodiment, the second target word lines may be alternately turned on and off for a first preset number of times, that is, a gate voltage of the high/low level may be repeatedly applied, so that the interference between the word lines can be clearly highlighted. Thus, the memory cell with a potential risk can be tested earlier.

In S213, a read operation may be performed on the memory cells connected to the first target word lines.

A sensing amplifier (SA) is used to read out the written values of the memory cells connected to the first target word lines, to determine whether the value of 0 stored in the memory cells connected to the first target word lines can be read correctly. If the read result is 1, it may indicate that the memory cells connected to the first target word lines are disturbed and fail.

In some embodiments, after performing the first voltage adjustment on the memory cells connected to the first target word lines in step 205, the method may further include the following step.

In S206, the memory cells connected to the first target word lines and the memory cells connected to the second target word lines may be refreshed.

The refreshing operation may be performed in a manner of 8K, which means presetting a manner of refreshing N memory cells once, that is, when the total number of memory cells is 8000N, 8000 refreshings are performed to refresh all the memory cells once.

In some embodiments, after alternately turning on and off the second target word lines for the second preset number of times upon the completion of the first voltage adjustment in step 211, the method may further include the following steps.

In S2111, the capacitance of the memory cells connected to the first target word lines may be restored to the default value (i.e., VARY Default in FIG. 2).

In S2112, the memory cells connected to the first target word lines and the memory cells connected to the second target word lines may be refreshed.

Similarly, the refreshing operation may be performed in a manner of 8K, which means presetting a manner of refreshing N memory cells once, that is, when the total number of memory cells is 8000N, 8000 refreshings are performed to refresh all the memory cells once.

In some embodiments, before restoring the capacitance of the memory cells connected to the first target word lines to the default value in S2111, the method may further include the following step.

After alternately turning on and off the second target word lines for the second preset number of times upon the completion of the first voltage adjustment in S211, the state of the second target word lines may be maintained for a period of time, to allow the memory cells connected to the second target word lines to be in a stable state.

In some embodiments, the method may further include the following step. When performing the first voltage adjustment on the memory cells connected to the first target word lines in S205, a bit line reference voltage corresponding to the memory cells connected to the second target word lines may be adjusted, to increase a voltage difference between the bit line reference voltage and a bit line output voltage of the memory cells connected to the second target word lines. An absolute value of the voltage adjustment for the bit line reference voltage corresponding to the memory cells connected to the second target word lines may be less than an absolute value of the first voltage adjustment for the memory cells connected to the first target word lines. In an alternative embodiment, the bit line reference voltage corresponding to the memory cells connected to the second target word lines may be adjusted to be decreased, and a value of the voltage adjustment may be 75 millivolts (i.e., VBLT-75mv in the FIG. 2).

In the embodiments of the present disclosure, when decreasing the voltage of the lower plate of the capacitor of each of the memory cells connected to the first target word lines, the bit line reference voltage of the second target word line may be adjusted at the same time. On the one hand, by decreasing the bit line reference voltage of the second target word lines, the charges of the memory cells corresponding to the memory cells written with the values of 1 can be restored more quickly when being refreshed. On the other hand, by adjusting the voltage of the lower plate of the capacitor of each of the memory cells connected to the first target word lines, the voltage difference between the first target word lines and the second target word lines can be increased, and thus, the test result can ensured to be more accurate.

In some embodiments, before writing the first data into the memory cells connected to the first target word lines in S201, the method may further include the following step.

The voltage of the memory cells connected to the second target word lines may be increased. The voltage increasement may be in a range of 0 to 500 millivolts. In a preferred embodiment, the voltage increasement may be in a range of 0 to 350 millivolts (i.e., VARY+(0~350mv) in FIG. 2).

In the embodiments of the present disclosure, after writing the value of 0 into the memory cells connected to the first target word lines and writing the value of 1 into memory cells connected to the second target word lines, the memory cells connected to the second target word lines with the written value of 1 may be continuously turn on and off. And then, it is tested whether the memory cells connected to the first target word lines with the written value of 0 fail. In the step, the charge value of the memory cells connected to the second target word lines with the written value of 1 may be pre-adjusted by increasing 0 to 500 millivolts. As such, the voltage of the memory cells connected to the second target word lines may be set to be within a range from 1 to 1.5 volts when writing the value of 1 finally. Therefore, the charge loss caused by natural leakage of the memory cells connected to the second target word lines with the written value of 1 can be improved, and the influence on the detection can be avoided.

In some embodiments, the charge value of the memory cells connected to the second target word lines with the written value of 1 may be pre-adjusted by increasing 350 millivolts, so that the voltage of the memory cells connected to the second target word lines may be set to be 1.35 volts when writing the value of 1.

Figure 3:
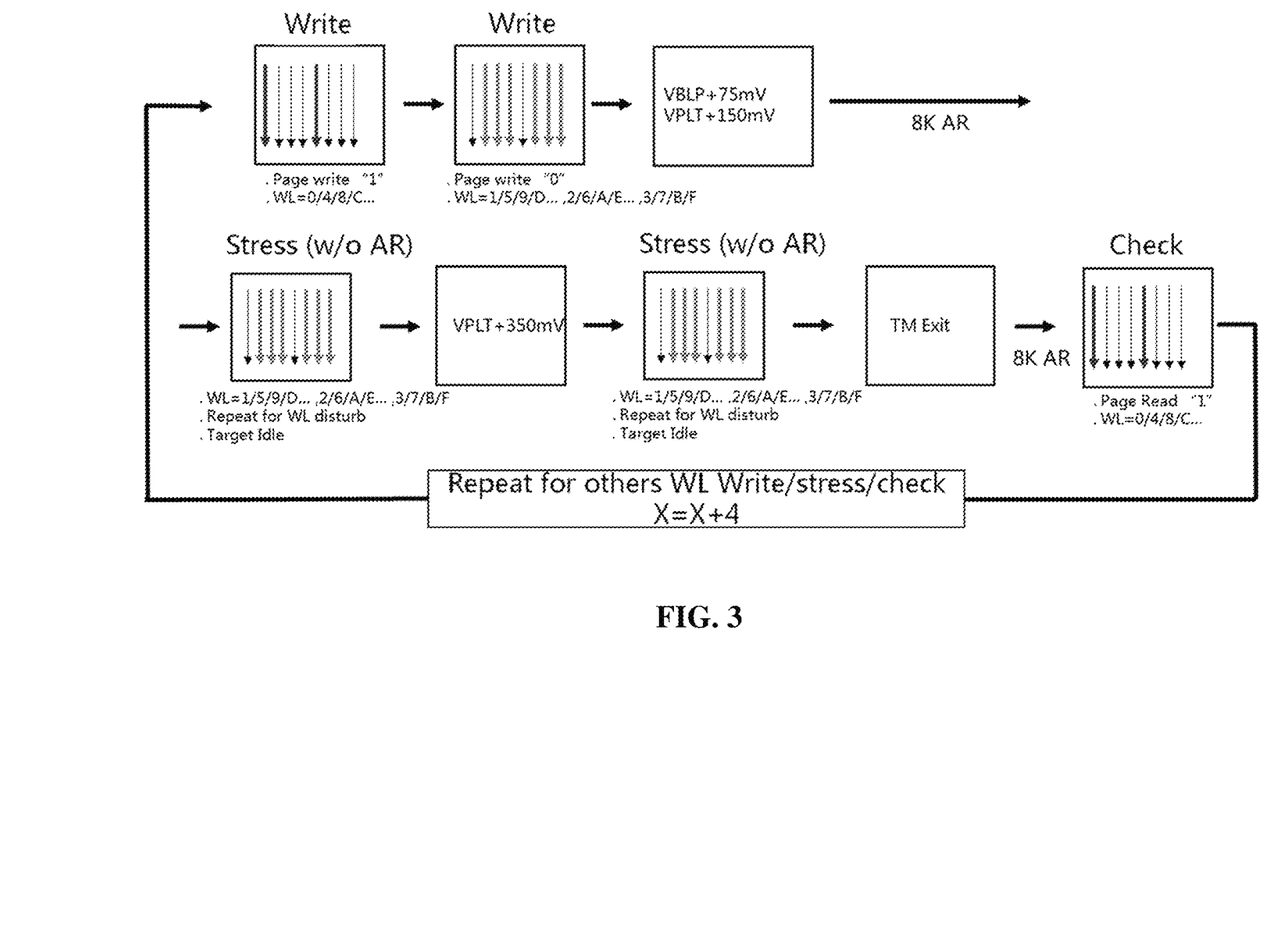
FIG. 3 is schematic diagram of processings of steps of a method for detecting a memory device according to another embodiment of the present disclosure.

Referring to FIG. 3, another embodiment of the present disclosure provides a detection method, which may include the following steps of S301 to S313:

In S301, first data may be written into memory cells connected to first target word lines.

In the embodiment, the first data may be written into the memory cells connected to the word lines numbered 0/4/8/C . . . in a Page Write manner, and the value of the first data may be 1.

In S303, second data may be written into memory cells connected to second target word lines arranged between the first target word lines, and the value of the second data may be 0.

In the embodiment, the second target data may be written into the memory cells connected to the word lines numbered 1/5/9/D . . . , 2/6/A/E . . . , or 3/7/B/F . . . in the Page Write manner, the value of the second target data may be 0.

In S305, a first voltage adjustment may be performed on the memory cells connected to the first target word lines, to increase a voltage difference between the first target word lines and the second target word lines. A voltage of a lower plate of a capacitor of each of the memory cells connected to the first target word lines may be increased, and a voltage increasement in the adjustment may be 150 millivolts (i.e., VPLT+150 my in FIG. 3, and the VPLT herein refers to the voltage of the lower plate of the capacitor of each of the memory cells connected to the first target word lines).

In the embodiment of the present disclosure, a voltage difference between the memory cells connected to the first target word lines and the memory cells connected to the second target word lines can be increased by increasing the voltage of the lower plate of the capacitor of each of the memory cells connected to the first target word lines. Thus, the memory cells with a potential risk can be tested earlier.

In S307, upon completion of the first voltage adjustment, the second target word lines may be alternately turned on and off for a first preset number of times.

In the embodiment, the second target word lines may be alternately turned on and off for a first preset number of times, that is, a gate voltage of the high/low level may be repeatedly applied, so that the interference between the word lines can be clearly highlighted. Thus, the memory cells with a potential risk can be tested earlier.

In S309, a second voltage adjustment may be performed on the memory cells connected to the first target word lines, to increase the voltage difference between the first target word lines and the second target word lines. The voltage of the lower plate of the capacitor of each of the memory cells connected to the first target word lines may be increased, and the voltage increasement in the adjustment may be 350 millivolts (i.e., VPLT+350mv in FIG. 3, and the VPLT herein refers to the voltage of the lower plate of the capacitor of each of the memory cells connected to the first target word lines).

In the embodiment of the present disclosure, the voltage difference between the memory cells connected to the first target word lines and the memory cells connected to the second target word lines can be further increased by increasing again the voltage of the lower plate of the capacitor of each of the memory cells connected to the first target word lines. Thus, the memory cells with a potential risk can be tested earlier. In this embodiment, in combination with the voltage increasement in the first voltage adjustment, the total voltage increasement in the embodiment may be 500 millivolts. Relative to one-time voltage increasement of 500 millivolts which may cause the failure of the memory cells that originally work normal to further bring additional test risks, the manner of gradually increasing the voltage is more mitigated, so that the test result can be ensured to be more accurate.

In S311, upon completion of the second voltage adjustment, the second target word lines may be alternately turned on and off for a second preset number of times.

In the embodiment, the second target word lines may be alternately turned on and off for a first preset number of times, that is, a gate voltage of the high/low level may be repeatedly applied, so that the interference between the word lines can be clearly highlighted. Thus, the memory cells with a potential risk can be tested earlier.

In S313, a read operation may be performed on the memory cells connected to the first target word lines.

A sensing amplifier (SA) is used to read out the written value of the memory cells connected to the first target word lines, to determine whether the value of 1 stored in the memory cells connected to the first target word lines can be read correctly. If the read result is 0, it may indicate that the memory cells connected to the first target word lines are disturbed and fail.

In some embodiments, after performing the first voltage adjustment on the memory cells connected to the first target word lines in step 305, the method may further include the following step.

In S306, the memory cells connected to the first target word lines and the memory cells connected to the second target word lines may be refreshed.

The refreshing operation may be performed in a manner of 8K, which means presetting a manner of refreshing N memory cells once, that is, when the total number of memory cells is 8000N, 8000 refreshings are performed to refresh all the memory cells once.

In some embodiments, after alternately turning on and off the second target word lines for the second preset number of times upon the completion of the first voltage adjustment in step 311, the method may further include the following steps.

In S3111, the capacitance of the memory cells connected to the first target word lines may be restored to the default value (i.e., VARY Default in FIG. 3).

In S3112, the memory cells connected to the first target word lines and the memory cells connected to the second target word lines may be refreshed.

Similarly, the refreshing operation may be performed in a manner of 8K, which means presetting a manner of refreshing N memory cells once, that is, when the total number of memory cells is 8000N, 8000 refreshings are performed to refresh all the memory cells once.

In some embodiments, before restoring the capacitance of the memory cells connected to the first target word lines to the default value in S3111, the method may further include the following step.

After alternately turning on and off the second target word lines for the second preset number of times upon the completion of the first voltage adjustment in S311, the state of the second target word lines may be maintained for a period of time, to allow the memory cells connected to the second target word lines to be in a stable state.

In some embodiments, the method may further include the following step.

When performing the first voltage adjustment on the memory cells connected to the first target word lines in S305, a bit line reference voltage corresponding to the memory cells connected to the second target word lines may be adjusted, to increase a voltage difference between the bit line reference voltage and a bit line output voltage of the memory cells connected to the second target word lines. An absolute value of the voltage adjustment for the bit line reference voltage corresponding to the memory cells connected to the second target word lines may be less than an absolute value of the first voltage adjustment for the memory cells connected to the first target word lines. In an alternative embodiment, the bit line reference voltage corresponding to the memory cells connected to the second target word lines may be adjusted to be increased, and a value of the voltage adjustment may be 75 millivolts (i.e., VBLT+75mv in FIG. 3).

In the embodiments of the present disclosure, when increasing the voltage of the lower plate of the capacitor of each of the memory cells connected to the first target word lines, the bit line reference voltage of the second target word line may be adjusted at the same time. On one hand, by increasing the bit line reference voltage of the second target word lines, the charges of the memory cells corresponding to the memory cells written with the values of 0 can be more quickly restored when being refreshed. On the other hand, by adjusting the voltage of the lower plate of the capacitor of each of the memory cells connected to the first target word lines, the voltage difference between the first target word lines and the second target word lines can be increased, and thus, the test result can ensured to be more accurate.

A second aspect of embodiments of the present disclosure provides an apparatus for detecting a memory device, the apparatus includes a first write module, a second write module, a first adjustment module, a first control module, a second adjustment module, a second control module and a read module.

The first write module is configured to write first data into memory cells connected to first target word lines.

The second write module is configured to write second data into memory cells connected to second target word lines arranged between the first target word lines.

The first adjustment module is configured to perform a first voltage adjustment on the memory cells connected to the first target word lines, to increase a voltage difference between the first target word lines and the second target word lines.

The first control module is configured to alternately turn on and off the second target word lines for a first preset number of times, upon completion of the first voltage adjustment.

The second adjustment module is configured to perform a second voltage adjustment on the memory cells connected to the first target word lines, to increase the voltage difference between the first target word lines and the second target word lines.

The second control module is configured to alternately turn on and off the second target word lines for a second preset number of times, upon completion of the second voltage adjustment.

The read module is configured to perform a read operation on the memory cells connected to the first target word lines.

In the embodiments of the present disclosure, on one hand, the first voltage adjustment is performed on the capacitors of the memory cells connected to a first target word lines, to increase the voltage difference between the memory cells connected to the first target word lines and the memory cells connected to the second target word lines, so that the memory cells with a potential risk can be tested earlier. On the other hand, the second target word lines are alternately turned on and off for twice, and the first voltage adjustment and the second voltage adjustment are performed on the capacitors of the memory cells connected to the first target word lines. Thus, the side effects can be reduced, and the test result can be ensured to be more accurate.

In some embodiments, the apparatus may further include a first refresh module, and the first refresh module is configured to refresh the memory cells connected to the first target word lines and the memory cells connected to the second target word lines.

In some embodiments, a value of the first data written by the first write module into the memory cells connected to the first target word lines may be configured to be 0, and a value of the second data written by the second write module into the memory cells connected to the second target word lines may be configured to be 1. The apparatus may further include a restoration module and a second refresh module. The restoration module may be configured to restore the capacitance of the memory cells connected to the first target word lines to the default value, and the second refresh module may be configured to refresh the memory cells connected to the first target word lines and the memory cells connected to the second target word lines.

In some embodiments, the apparatus may further include a third adjustment module. The third adjustment module may be configured to adjust a bit line reference voltage corresponding to the memory cells connected to the second target word lines, when the first adjustment module is performing the first voltage adjustment on the memory cells connected to the first target word lines, to increase a voltage difference between the bit line reference voltage and a bit line output voltage of the memory cells connected to the second target word lines.

A third aspect of embodiments of the present disclosure provides a computer storage medium having stored thereon a computer program which, when executed by a processor, implements steps of the method for detecting the memory device described above.

A fourth aspect of embodiments of the present disclosure provides an electronic device including a processor and a memory, the memory is configured to store a computer program executable by the processor; when the computer program is executed by the processor, the processor is configured to implement steps of the method for detecting the memory device described above.

It should be understood that the aforementioned embodiments of the present disclosure are merely intended to illustrate or explain the principles of the present disclosure, and are not intended to limit the present disclosure. Accordingly, any modifications, equivalent replacements, improvements, etc. made without departing from the spirit and scope of the present disclosure should be included within the scope of the present disclosure. Furthermore, the appended claims of the present disclosure are intended to cover all variations and modifications that fall within the scope and boundaries of the appended claims, or the equivalents of such scope and boundaries.

Those skilled in the art will appreciate that all or part of the steps of the methods from the aforementioned embodiments may be accomplished by instructing the relevant hardware through a program that may be stored in a computer readable storage medium, and that the program, when executed, includes the flow of the aforementioned embodiments of the methods. The storage medium may be a magnetic disk, an optical disc, a Read-Only Memory (ROM), a random access memory (RAM), or the like.

The steps in the methods from the embodiments of the present disclosure may be sequentially adjusted, merged, and deleted as needed. The modules in the system of the embodiments of the present disclosure may be combined, divided and deleted as needed.

The invention claimed is:

1. A method for detecting a memory device, comprising:
writing first data into memory cells connected to first target word lines;
writing second data into memory cells connected to second target word lines arranged between the first target word lines;
performing a first voltage adjustment on the memory cells connected to the first target word lines, to increase a voltage difference between the first target word lines and the second target word lines;
alternately turning on and off the second target word lines for a first preset number of times, upon completion of the first voltage adjustment;
performing a second voltage adjustment on the memory cells connected to the first target word lines, to increase the voltage difference between the first target word lines and the second target word lines;
alternately turning on and off the second target word lines for a second preset number of times, upon completion of the second voltage adjustment; and
performing a read operation on the memory cells connected to the first target word lines.

2. The method of claim 1, wherein after performing the first voltage adjustment on the memory cells connected to the first target word lines, the method further comprises:
refreshing the memory cells connected to the first target word lines and the memory cells connected to the second target word lines.

3. The method of claim 1, wherein a value of the first data written into the memory cells connected to the first target word lines is configured to be 0, and a value of the second data written into the memory cells connected to the second target word lines is configured to be 1; and wherein before writing the first data to the memory cells connected into the first target word lines, the method further comprises:
increasing a capacitance of the memory cells connected to the first target word lines from a default value to a first target capacitance value, wherein a voltage difference between the first target capacitance value and the default value is in a range of 0 to 350 millivolts.

4. The method of claim 3, wherein after alternately turning on and off the second target word lines for the second preset number of times, upon the completion of the first voltage adjustment, the method further comprises:
restoring the capacitance of the memory cells connected to the first target word lines to the default value; and
refreshing the memory cells connected to the first target word lines and the memory cells connected to the second target word lines.

5. The method of claim 1, further comprising:
when performing the first voltage adjustment on the memory cells connected to the first target word lines, adjusting a bit line reference voltage corresponding to the memory cells connected to the second target word lines, to increase a voltage difference between the bit line reference voltage and a bit line output voltage of the memory cells connected to the second target word lines.

6. The method of claim 5, wherein a value of the first data written into the memory cells connected to the first target word lines is configured to be 0, and a value of the second data written into the memory cells connected to the second target word lines is configured to be 1; and
wherein the first voltage adjustment is configured to decrease a voltage of a lower plate of a capacitor of each of the memory cells connected to the first target word lines, and the second voltage adjustment is configured to decrease a voltage of a lower plate of a capacitor of each of the memory cells connected to the second target word lines.

7. The method of claim 6, wherein the adjusting the bit line reference voltage corresponding to the memory cells connected to the second target word lines comprises:
decreasing the bit line reference voltage corresponding to the memory cells connected to the second target word lines.

8. The method of claim 5, wherein a sum of a voltage decreasement in the first voltage adjustment and a voltage decreasement in the second voltage adjustment is less than or equal to 500 millivolts; and
wherein the voltage decreasement in the first voltage adjustment is less than or equal to 150 millivolts, and the voltage decreasement in the second voltage adjustment is less than or equal to 350 millivolts.

9. The method of claim 5, wherein before alternately turning on and off the second target word lines for the first preset number of times, the method further comprises:
increasing a capacitance of the memory cells connected to the first target word lines to a second target capacitance value.

10. The method of claim 9, wherein a voltage difference between the second target capacitance value and a default capacitance value of the memory cells connected to the first target word lines is in a range of 500 to 750 millivolts.

11. The method of claim 5, wherein a value of the first data written into the memory cells connected to the first target word lines is configured to be 1, and a value of the second data written into the memory cells connected to the second target word lines is configured to be 0; and
wherein the first voltage adjustment is configured to increase a voltage of a lower plate of a capacitor of each of the memory cells connected to the first target word lines, and the second voltage adjustment is configured to increase a voltage of a lower plate of a capacitor of each of the memory cells connected to the second target word lines.

12. The method of claim 11, wherein the adjusting the bit line reference voltage corresponding to the memory cells connected to the second target word lines comprises:
increasing the bit line reference voltage corresponding to the memory cells connected to the second target word lines.

13. The method of claim 11, wherein a sum of a voltage increasement in the first voltage adjustment and a voltage increasement in the second voltage adjustment is less than or equal to 500 millivolts; and
wherein the voltage increasement in the first voltage adjustment is less than or equal to 150 millivolts, and the voltage increasement in the second voltage adjustment is less than or equal to 350 millivolts.

14. An electronic device, comprising a processor, a non-transitory computer readable storage medium and a computer program stored in the non-transitory computer readable storage medium and executable by the processor; wherein the processor, when executing the computer program, is configured to:
write first data into memory cells connected to first target word lines;

write second data into memory cells connected to second target word lines arranged between the first target word lines;

perform a first voltage adjustment on the memory cells connected to the first target word lines, to increase a voltage difference between the first target word lines and the second target word lines;

alternately turn on and off the second target word lines for a first preset number of times, upon completion of the first voltage adjustment;

perform a second voltage adjustment on the memory cells connected to the first target word lines, to increase the voltage difference between the first target word lines and the second target word lines;

alternately turn on and off the second target word lines for a second preset number of times, upon completion of the second voltage adjustment; and perform a read operation on the memory cells connected to the first target word lines.

15. The electronic device of claim 14, wherein the processor is further configured to:

refresh the memory cells connected to the first target word lines and the memory cells connected to the second target word lines.

16. The electronic device of claim 14, wherein a value of the first data written into the memory cells connected to the first target word lines is configured to be 0, and a value of the second data written into the memory cells connected to the second target word lines is configured to be 1; and wherein the processor is further configured to:

restore capacitance of the memory cells connected to the first target word lines to a default value; and refresh the memory cells connected to the first target word lines and the memory cells connected to the second target word lines.

17. The electronic device of claim 14, wherein the processor is further configured to:

adjust a bit line reference voltage corresponding to the memory cells connected to the second target word lines, when performing the first voltage adjustment on the memory cells connected to the first target word lines, to increase a voltage difference between the bit line reference voltage and a bit line output voltage of the memory cells connected to the second target word lines.

18. A non-transitory computer storage medium having stored thereon a computer program which, when executed by a processor, implements a method for detecting a memory device, the method comprising:

writing first data into memory cells connected to first target word lines;

writing second data into memory cells connected to second target word lines arranged between the first target word lines;

performing a first voltage adjustment on the memory cells connected to the first target word lines, to increase a voltage difference between the first target word lines and the second target word lines;

alternately turning on and off the second target word lines for a first preset number of times, upon completion of the first voltage adjustment;

performing a second voltage adjustment on the memory cells connected to the first target word lines, to increase the voltage difference between the first target word lines and the second target word lines;

alternately turning on and off the second target word lines for a second preset number of times, upon completion of the second voltage adjustment; and performing a read operation on the memory cells connected to the first target word lines.

19. The non-transitory computer storage medium of claim 18, wherein after performing the first voltage adjustment on the memory cells connected to the first target word lines, the method further comprises:

refreshing the memory cells connected to the first target word lines and the memory cells connected to the second target word lines.

20. The non-transitory computer storage medium of claim 18, wherein a value of the first data written into the memory cells connected to the first target word lines is configured to be 0, and a value of the second data written into the memory cells connected to the second target word lines is configured to be 1; and wherein before writing the first data to the memory cells connected into the first target word lines, the method further comprises:

increasing a capacitance of the memory cells connected to the first target word lines from a default value to a first target capacitance value, wherein a voltage difference between the first target capacitance value and the default value is in a range of 0 to 350 millivolts.

\* \* \* \* \*